(12) United States Patent
Lee et al.

(10) Patent No.: US 11,657,855 B2
(45) Date of Patent: May 23, 2023

(54) MEMORY CARD INCLUDING INTERCONNECTION TERMINALS

(71) Applicant: SAMSUNG ELECTRONICS CO., LTD., Suwon-si (KR)

(72) Inventors: Injae Lee, Seoul (KR); Seungwan Koh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 17/231,521

(22) Filed: Apr. 15, 2021

(65) Prior Publication Data

US 2022/0084559 A1 Mar. 17, 2022

(30) Foreign Application Priority Data

Sep. 17, 2020 (KR) ........................ 10-2020-0119593

(51) Int. Cl.
| | |
|---|---|
| *G11C 5/06* | (2006.01) |
| *G11C 7/10* | (2006.01) |
| *G11C 5/14* | (2006.01) |
| *G06F 13/16* | (2006.01) |
| *H01L 23/528* | (2006.01) |

(52) U.S. Cl.
CPC ............ *G11C 5/06* (2013.01); *G06F 13/1668* (2013.01); *G11C 5/14* (2013.01); *G11C 7/10* (2013.01); *H01L 23/5286* (2013.01)

(58) Field of Classification Search
CPC ................ G11C 5/06; G11C 5/14; G11C 7/10
USPC ............................................. 365/185.05, 63
See application file for complete search history.

(56) References Cited

U.S. PATENT DOCUMENTS

| | | | |
|---|---|---|---|
| 7,809,866 B2 | 10/2010 | Liu et al. | |
| 7,864,540 B2 | 1/2011 | Takiar | |
| 8,581,372 B2 | 11/2013 | Asada et al. | |
| 10,037,784 B2 | 7/2018 | Han et al. | |
| 10,374,342 B2 * | 8/2019 | Koh .................. | H01R 13/2464 |
| 10,380,055 B2 | 8/2019 | Han et al. | |
| 10,403,329 B2 | 9/2019 | Han et al. | |
| 11,093,811 B2 * | 8/2021 | Fujimoto ......... | G06K 19/07733 |
| 11,308,380 B1 * | 4/2022 | Mathew ............... | G06K 7/0043 |
| 2004/0059846 A1 | 3/2004 | Liu et al. | |
| 2008/0025003 A1 | 1/2008 | Nishizawa et al. | |
| 2008/0049392 A1 | 2/2008 | Takiar | |
| 2012/0049378 A1 | 3/2012 | Asada et al. | |
| 2017/0148492 A1 | 5/2017 | Han et al. | |
| 2017/0154003 A1 | 6/2017 | Han et al. | |
| 2019/0207334 A1 | 7/2019 | Koh et al. | |

\* cited by examiner

*Primary Examiner* — Connie C Yoha
(74) *Attorney, Agent, or Firm* — F. Chau & Associates, LLC

(57) ABSTRACT

A memory card includes a plurality of interconnection terminals aligned in a row direction and a column direction on a substrate. Each of the plurality of interconnection terminals has a first-axis length equal to no more than 1.2 time that of a second-axis length thereof. A non-volatile memory device is disposed on the substrate. The non-volatile memory device is electrically connected to at least one interconnection terminal corresponding thereto from among the plurality of interconnection terminals.

19 Claims, 7 Drawing Sheets

MEMORY CARD INCLUDING INTERCONNECTION TERMINALS

CROSS-REFERENCE TO THE RELATED APPLICATION

This non-provisional patent application claims priority under 35 U.S.C. § 119 to Korean Patent Application No. 10-2020-0119593, filed on Sep. 17, 2020, in the Korean intellectual Property Office, the disclosure of which is herein incorporated by reference in its entirety.

TECHNICAL FIELD

The present disclosure relates to a memory card and, more specifically, to a memory card including a plurality of interconnection terminals.

DISCUSSION OF THE RELATED ART

Advances in the field of semiconductor devices have allowed for the production of large-capacity storage devices in miniature form. A miniaturized storage device utilizes a plurality of interconnection terminals for establishing an electrical connection to an external device. Sockets of the external device have an arrangement and a shape corresponding to those of the plurality of interconnection terminals of the miniaturized storage device. Configurations of the sockets and the plurality of interconnection terminals influence electrical characteristics and durability. The disposition of the plurality of interconnection terminals influences design flexibility of the external device.

SUMMARY

A memory card according to exemplary embodiments of the disclosure includes a plurality of interconnection terminals aligned in a row direction and a column direction on a substrate. Each of the plurality of interconnection terminals has a first-axis length equal to no more than 1.2 times that of a second-axis length thereof. The first-axis length may be a longer-axis length and the second-axis length may be a shorter-axis length, or the first-axis length and second-axis length may be equal to each other. A non-volatile memory device is disposed on the substrate. The non-volatile memory device is electrically connected to at least one interconnection terminal corresponding thereto from among the plurality interconnection terminals.

An electronic system according to exemplary embodiments of the disclosure includes a bus, and a controller connected to the bus. An input/out device connected to the bus is provided. An interface connected to the bus is provided. The electronic system includes a memory device connected to the bus. The memory device includes a memory card. The memory card includes a substrate, a plurality of interconnection terminals aligned in a row direct on and a column direction on the substrate, each of the plurality of interconnection terminals having a first-axis length equal to no more than 1.2 times that of a second-axis length thereof, and a non-volatile memory device disposed on the substrate and is electrically connected to at least one interconnection terminal corresponding thereto from among the plurality of interconnection terminals.

A memory card according to exemplary embodiments of the disclosure includes a plurality of interconnection terminals aligned in a row direction and a column direction on a substrate. Each of the plurality of interconnection terminals has a first-axis length equal to no more than 1.2 times that of a second-axis length thereof. The memory card includes a non-volatile memory device disposed on the substrate and electrically connected to at least one interconnection terminal corresponding thereto from among the plurality of interconnection terminals. The substrate includes a first edge extending in the row direction, a second edge extending in the column direction while being adjacent to the first edge, a third edge opposing the second edge while being adjacent to the first edge, a fourth edge opposing the first edge while being adjacent to the second edge and the third edge, and a direction indicator adjacent to a first corner at which an extension of the first edge and art extension of the second edge intersect with each other. The plurality of interconnection terminals includes first to third terminals disposed at a first row adjacent to the first edge, fourth and fifth terminals disposed at a second row, and sixth to eighth terminals disposed at a third row adjacent to the fourth edge. The second row is disposed between the first row and the third row. The first terminal, the fourth terminal and the sixth terminal are disposed at a first column adjacent to the second edge. The second terminal and the seventh terminal are disposed at a second column. The third terminal, the fifth terminal and the eighth terminal are disposed at a third column adjacent to the third edge. The second column is disposed between the first column and the third column.

An electronic system according to exemplary embodiments of the disclosure includes a bus, and a controller connected to the bus. An input/output device connected to the bus is provided. An interface connected to the bus is provided. The electronic system includes a memory device connected to the bus. The memory device includes a memory card. The memory card includes a substrate, a plurality of interconnection terminals aligned in a row direction and a column direction on the substrate, each of the plurality of interconnection terminals having a first-axis length equal to no more than 1.2 times that of a second-axis length thereof, and a non-volatile memory device disposed on the substrate and electrically connected to at least one interconnection terminal corresponding thereto from among the plurality of interconnection terminals. The substrate includes a first edge extending in the row direction, a second edge extending in the column direction while being adjacent to the first edge, a third edge opposing the second edge while being adjacent to the first edge, a fourth edge opposing the first edge while being adjacent to the second edge and the third edge, and a direction indicator adjacent to a first corner at which an extension of the first edge and an extension of the second edge intersect with each other. The plurality of interconnection terminals includes first to third terminals disposed at a first row adjacent to the first edge, fourth and fifth terminals disposed at a second row, and sixth to eighth terminals disposed at a third row adjacent to the fourth edge. The second row is disposed between the first row and the third row. The first terminal, the fourth terminal and the sixth terminal are disposed at a first column adjacent to the second edge. The second terminal and the seventh terminal are disposed at a second column. The third terminal, the fifth terminal and the eighth terminal are disposed at a third column adjacent to the third edge. The second column is disposed between the first column and the third column.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
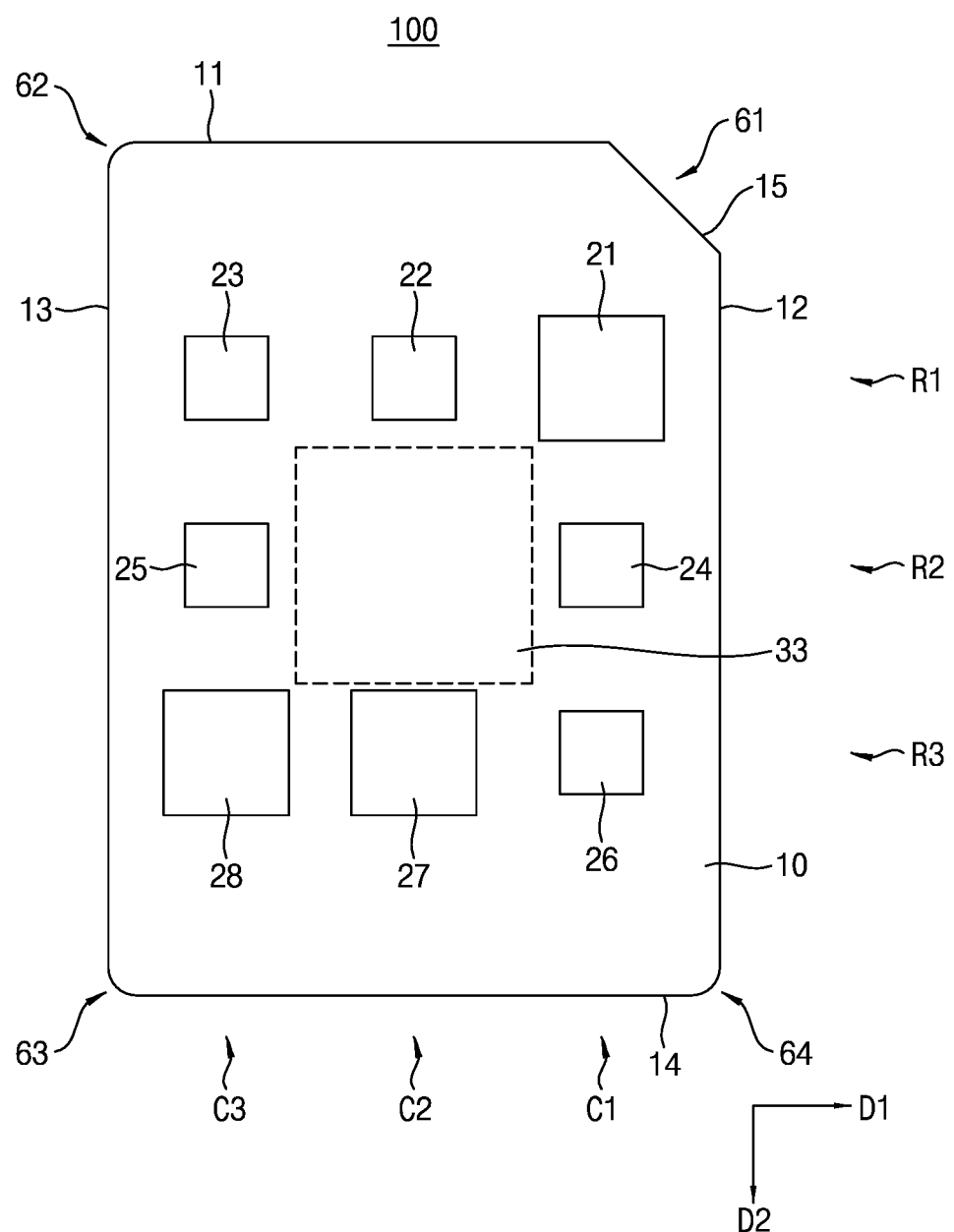
FIG. 1 is a layout view illustrating a memory card according to exemplary embodiments of the disclosure.

FIG. 1 is a layout view illustrating a memory card according to exemplary embodiments of the disclosure. In an embodiment, the memory card may be embodied as a universal flash storage (UFS) or a UFS card.

Referring to FIG. 1, a memory card 100, according to exemplary embodiments of the disclosure, may include a substrate 10 including a first to fourth edges 11, 12, 13 and 14 and a direction indicator 15, a plurality of interconnection terminals 21, 22, 23, 24, 25, 26, 27 and 28, and at least one non-volatile memory device 33. The direction indicator 15 may be a fifth edge of the substrate 10 giving the substrate 10 a substantially pentagonal shape.

The first edge 11 may extend in a first direction D1, for example, a row direction. The second edge 12 may be adjacent to the first edge 11 and may extend m a second direction D2, for example, a column direction. As used herein, the phrase "extension lines" means an imaginary line that may be drawn over an edge but continues past the ends of the edge. An extension line of the second edge 12 may intersect with an extension line of the first edge 11. In an embodiment, the extension line of the second edge 12 may be orthogonal with respect to the extension line of the first edge 11. The third edge 13 may be adjacent to the first edge 11 and may extend in the second direction D2. The third edge 13 may oppose the second edge 12. An extension line of the third edge 13 may interest with the extension line of the first edge 11. In an embodiment, the extension line of the third edge 13 may be orthogonal with respect to the extension line of the first edge 11. The third edge 13 may be parallel to the second edge 12. The fourth edge 14 may be adjacent to the second edge 12 and the third edge 13 and may extend in the first direction D1. The fourth edge 14 may oppose the first edge 11. An extension line of the first edge 14 may intersect with the extension line of the second edge 12 and the extension line of the third edge 13. In an embodiment, the extension line of the fourth edge 14 may be orthogonal with respect to the extension line of the second edge 12 and the extension line of the third edge 13. The fourth edge 14 may be parallel to the first edge 11.

A first corner 61 may be defined at an intersection between the extension line of the second edge 12 and the extension line at the first edge 11. A second corner 62 may be defined at an intersection between the extension line of the third edge 13 and the extension line of the first edge 11. A third corner 63 may be defined at an intersection between the extension line of the third edge 13 and the extension line of the fourth edge 14. A fourth corner 64 may be defined at an intersection between the extension line of the second edge 12 and the extension line of the fourth edge 14.

The direction indicator 15 may be disposed adjacent to the first corner 61. The direction indicator 15 may include a cut surface adjacent to the first corner 61. The direction indicator 15 may perform a function for preventing erroneous insertion of the memory card 100 as a socket that receives the memory card 100 may be shaped so as to receive the direction indicator in only one region thereof. The second corner 62, the third corner 63 and the fourth corner 64 of the substrate 10 may be finished to be rounded or may be right angles.

The substrate 10 may include various materials such as a printed circuit board (PCB), an epoxy molding compound (EMC), an interposer, a re-distribution layer (RDL), silicon, ceramic, glass, sapphire, plastic or a combination thereof. The at least one non-volatile memory device 33 may be disposed on the substrate 10. Various active and/or passive devices such as a memory controller, a communication chip, a buffer chip, a capacitor, a resistor, an inductor or a combination thereof may be disposed on the substrate 10. The at least one non-volatile memory device 33 may be mounted on the substrate 10 using various packaging technologies such as multi-chip package (MCP), package-on-package (POP), chip-scale package (CSP), chip-on-board (COB), system-in-package (SIP), wafer-level package (WLP), flip-chip package (FCP) or a combination thereof. The at least one non-volatile memory device 33 may be electrically connected to corresponding ones of the plurality of interconnection terminals 21, 22, 23, 24, 25, 26, 27 and 28. For example, there may be multiple non-volatile memory devices 33, each of which is connected to one or more of the interconnection terminals 21, 22, 23, 34, 25, 26, and 27.

The at least one non-volatile memory device 33 may include flash memory, magnetoresistive random access memory (MRAM), ferroelectric random access memory (FeRAM), phase-change random access memory (PRAM), resistive memory or a combination thereof. In an embodiment, the at least one non-volatile memory device 33 may include flash memory such as VNAND. The at least one non-volatile memory device 33 may include a large-capacity memory device of 1 GB or more. For example, the at least one non-volatile memory device 33 may have a storage capacity of 32 GB to 1,024 TB. In an embodiment, the at least one non-volatile memory device 33 may include a structure in which a plurality of VNAND chips is stacked.

The plurality of interconnection terminals 21, 22, 23, 24, 25, 26, 27 and 28 may be arranged at one surface of the substrate 10 in a row direction and a column direction. The plurality of interconnection terminals 21, 22, 23, 24, 25, 26, 27 and 28 may be disposed to form at least 2 rows and at least two columns. The row direction may correspond to the first direction D1 (as each row may extend in the D1 direction), whereas the column direction may correspond to the second direction D2 (as each column may extend in the D2 direction). Each of the plurality of interconnection terminals 21, 22, 23, 24, 25, 26, 27 and 28 may have a first-side length equal to no more than 1.2 times that of a second-side length thereof. Each of the plurality of interconnection terminals 21, 22, 23, 24, 25, 26, 27 and 28 may have a shape of a quadrilateral, an oval, a polygon or a combination thereof. In an embodiment, in each of the plurality of interconnection terminals 21, 22, 23, 24, 25, 26, 27 and 28, the first-side length thereof may be substantially equal to the second-side length thereof. Each of the plurality of interconnection terminals 21, 22, 23, 24, 25, 26, 27 and 28 may have a shape that is a substantial square, a substantial regular polygon, a substantial circle or a combination thereof. The plurality of interconnection terminals 21, 22, 23, 24, 25, 26, 27 and 28 may include a conductive material such as copper (Cu), nickel (Ni), aluminum (Al), tungsten (W), tungsten nitride (WN), titanium (Ti), titanium nitride TiN, tantalum (Ta), tantalum nitride (TaN), cobalt (Co), platinum (Pt), ruthenium (Ru), silver (Ag), gold (Au), tin (Sn) or a combination thereof.

In an embodiment, the plurality of interconnection terminals 21, 22, 23, 24, 25, 26, 27 and 28 may include a first terminal 21, a second terminal 22, a third terminal 23, a fourth terminal 24, a fifth terminal 25, a sixth terminal 26, a seventh terminal 27 and an eighth terminal 28 which are spaced apart from one another. The first terminal 21, the second terminal 22 and the third terminal 23 may be disposed at a first row R1 adjacent to the first edge 11. The fourth terminal 24 and the fifth terminal 25 may be disposed at a second row R2. The sixth terminal 26, the seventh terminal 27 and the eighth terminal 28 may be disposed at a third row R3 adjacent to the fourth edge 14. The second row R2 may be disposed between the first row R1 and the third row R3.

The first terminal 21, the fourth terminal 24 and the sixth terminal 26 may be disposed at a first column C1 adjacent to the second edge 12. The second terminal 22 and the seventh terminal 27 may be disposed at a second column C2. The third terminal 23, the fifth terminal 25 and the eighth terminal 28 may be disposed at a third column C3 adjacent to the third edge 13. The second column C2 may be disposed between the first column C1 and the third column C3.

The first terminal 21 may be disposed adjacent the first edge 61 and the direction indicator 15. The third terminal 23 may be disposed adjacent to the second edge 62. The second terminal 22 may be disposed between the first terminal 21 and the third terminal 23. The sixth terminal 26 may be disposed adjacent to the fourth edge 64. The eighth terminal 28 may be disposed adjacent to the third edge 63. The seventh terminal 27 may be disposed between the sixth terminal 26 and the eighth terminal 28. The fourth terminal 24 may be disposed between the first terminal 21 and the sixth terminal 26. The fifth terminal 25 may be disposed between the third terminal 23 and the eighth terminal 28.

Centers of the second terminal 22, the third terminal 23, the fourth terminal 24, the fifth terminal 25, the sixth terminal 26 and the seventh terminal 27 may be symmetrically disposed with respect to a straight line passing through a center of the first terminal 21 and a center of the eighth terminal 28. Straight lines sequentially connecting the centers of the first to eighth terminals 21 to 28 may form a substantial square.

The first terminal 21 may correspond to a ground terminal. The eighth terminal 28 may correspond to a first power terminal. The second terminal 27 may be a second power terminal to which a lower voltage than that of the first power terminal is applied. For example, a voltage of 3.0 V to 3.6 V may be applied to the eighth terminal 28. A voltage of 1.5 V to 2.1 V may be applied to the seventh terminal 27. The fifth terminal 25 may correspond to a clock signal terminal. A clock such as a reference clock may be applied to the fifth terminal 25.

The second terminal 22, the third terminal 23, the fourth terminal 24 and the sixth terminal 26 may correspond to a plurality of data input/output terminals. In an embodiment, the second terminal 22 and the third terminal 23 may correspond to a first pair of data transmitting terminals. The fourth terminal 24 and the sixth terminal 26 may correspond to a second pair of data receiving terminals. In an embodiment, the second terminal 22 and the third terminal 23 may correspond to a first pair of data transmitting terminals using serial interface technology. The fourth terminal 24 and the sixth terminal 26 may correspond to a second pair of data receiving terminals using serial interface technology.

Each of the first terminal 21, the seventh terminal 27 and the eighth terminal 28 may have a greater cross-sectional area than each of the third terminal 23, the fourth terminal 24, the fifth terminal 25 and the sixth terminal 26. The second terminal 22 and the third terminal 23 may be disposed symmetrically with the fourth terminal 24 and the sixth terminal 26 with respect to a straight line passing through the center of the first terminal 21 and the center of the eighth terminal 28. In an embodiment, the minimum distance between the first edge 11 and the first terminal 21 may be smaller than the minimum distance between the first edge 11 and the second terminal 22. The minimum distance between the first edge 11 and the first terminal 21 may be smaller than the minimum distance between the first edge 11 and the third terminal 23. The minimum distance between the second edge 12 and the first terminal 21 may be smaller than the minimum distance between the second edge 12 and the fourth terminal 24. The minimum distance between the second edge 12 and the first terminal 21 may be smaller than the minimum distance between the second edge 12 and the sixth terminal 26.

Figure 2:
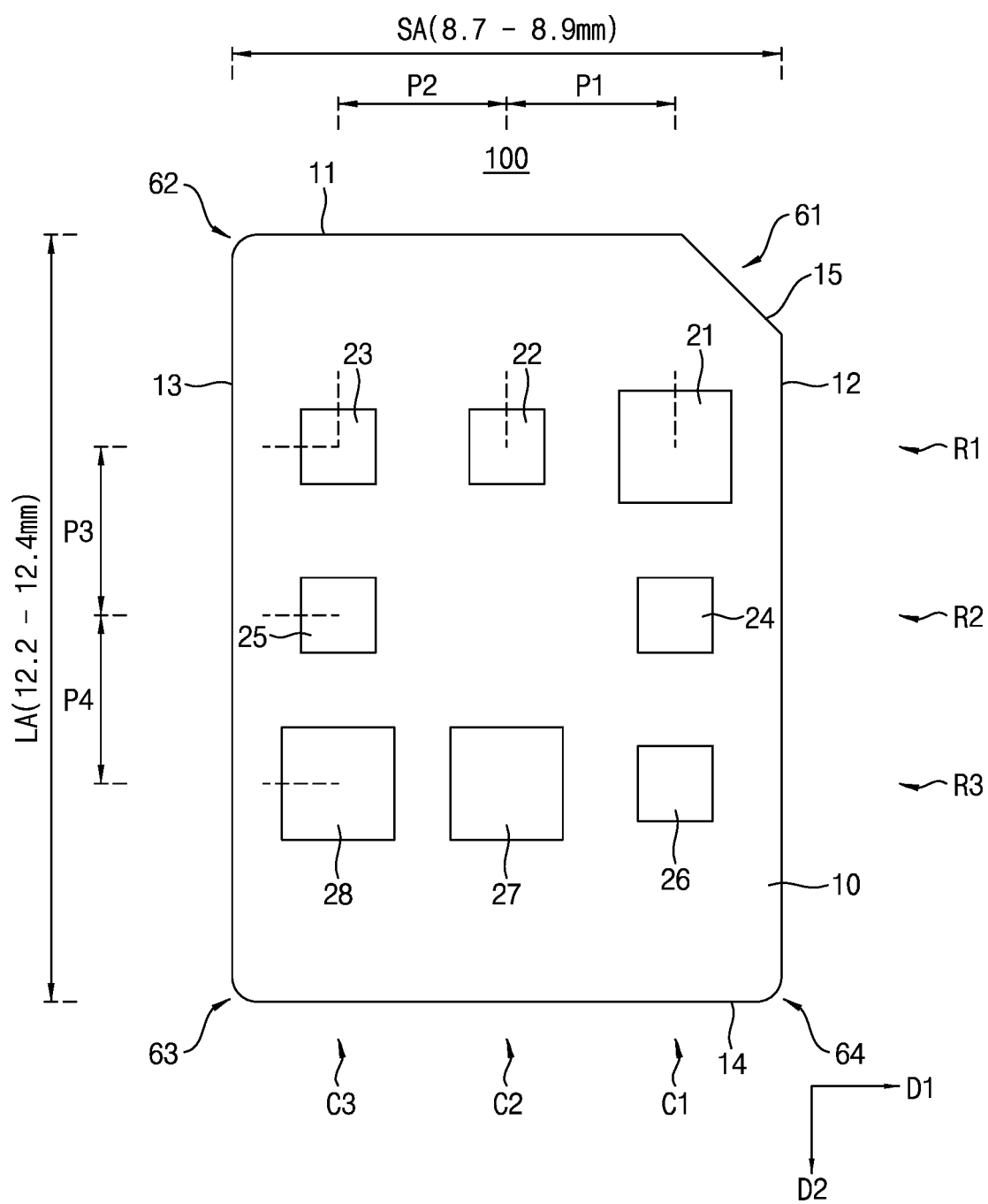
FIG. 2 is a plan view illustrating a configuration of FIG. 1 from which a part of the configuration is omitted.

FIG. 2 is a plan view illustrating a configuration of FIG. 1 from which a part of the configuration is omitted.

Referring to FIG. 2, in an embodiment, the memory card 100 may include a shorter axis SA of 8.7 to 8.9 mm and a longer axis LA of 12.2 mm to 12.4 mm. Each of the first terminal 21, the seventh terminal 27 and the eighth terminal 28 may be a substantial square in which each side has a length of 1.5 mm to 1.9 mm. Each of the second terminal 22, the third terminal 23, the fourth terminal 24, the fifth terminal 25 and the sixth terminal 26 may be a substantial square in which each side has a length of 1.0 mm to 1.4 mm.

The distance between the center of the first terminal 21 and the center of of the second terminal 22 may be a first pitch P1. The distance between the center of the sixth terminal 26 and the center of the seventh terminal 27 may be the first pitch P1. The distance between the center of the second terminal 22 and the center of the third terminal 23 may be a second pitch P2. The distance between the center of the seventh terminal 27 and the center of the eighth terminal 28 may be the second pitch P2. The second pitch P2 may be substantially equal to the first pitch P1. For example, each of the first pitch P1 and the second pitch P2 may be 2.5 mm to 3.0 mm. For example, each of the first pitch P1 and the second pitch P2 may be about 2.75 mm.

The distance between the center of the third terminal 23 and the center of the fifth terminal 25 may be a third pitch P3. The distance between the center of the first terminal 21 and the center of the fourth terminal 24 may be the third pitch P3. The distance between the center of the fifth terminal 25 and the center of the eighth terminal 28 may be a fourth pitch P4. The distance between the center of the fourth terminal 24 and the center of the sixth terminal 26 may be the fourth pitch P4. The fourth pitch P4 may be substantially equal to the third pitch P3. For example, each of the third pitch P3 and the fourth pitch P4 may be 2.5 min to 3.0 mm. Each of the third pitch P3 and the fourth pitch P4 may be about 2.75 mm. In an embodiment, each of the second pitch P2, the third pitch P3 and the fourth pitch P4 may be substantially equal to the first pitch P1.

FIGS. 3 to 6 are plan views illustrating a memory card according to exemplary embodiments of the disclosure.

Figure 3:
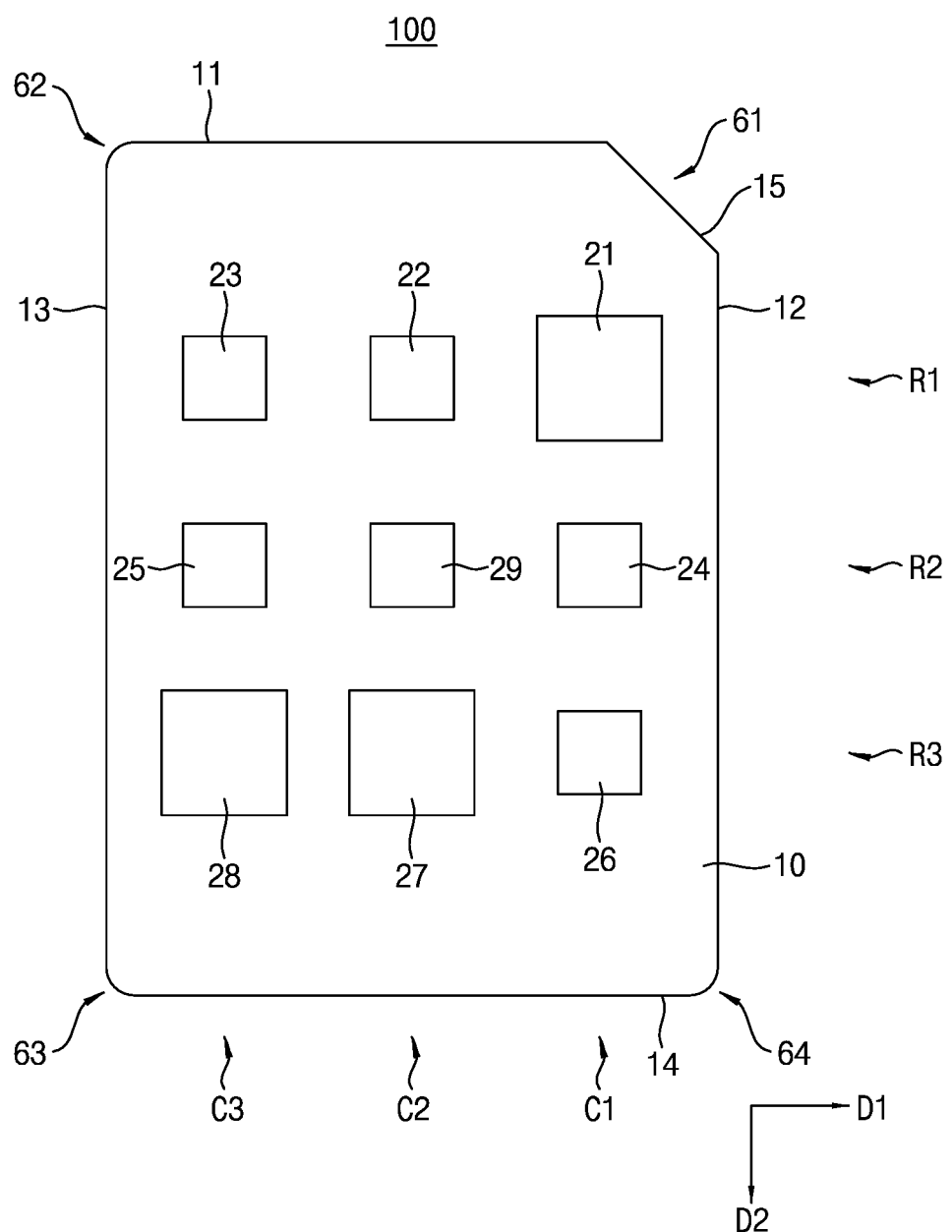
FIGS. 3 to 6 are plan view illustrating a memory card according to exemplary embodiments of the disclosure.

Referring to FIG. 3, a memory card 100, according to exemplary embodiments of the disclosure, may include a substrate 10, and a plurality of interconnection terminals 21, 22, 23, 24, 25, 26, 27, 28 and 29.

In an embodiment, the plurality of interconnection terminals 21, 22, 23, 24, 25, 26, 27, 28 and 29 may include a first terminal 21, a second terminal 22, a third terminal 23, a fourth terminal 24, a fifth terminal 25, a sixth terminal 26, a seventh terminal 27, an eighth terminal 28 and a ninth terminal 29 which are spaced apart from one another. The first terminal 21, the second terminal 22 and the third terminal 23 may be disposed at a first row R1. The fourth terminal 24, the ninth terminal 29 and the fifth terminal 25 may be disposed at a second row R2. The sixth terminal 26, the seventh terminal 27 and the eighth terminal 28 may be disposed at a third row R3. The first terminal 21, the fourth terminal 24 and the sixth terminal 26 may be disposed at a first column C1. The second terminal 22, the ninth terminal 29 and the seventh terminal 27 may be disposed at a second column C2. The third terminal 23, the fifth terminal 25 and the eighth terminal 28 may be disposed at a third column C3. The ninth terminal 29 may correspond to a reserve terminal. The ninth terminal 29 may have substantially the same size, the same shape and the same material as each of the second terminal 22, the third terminal 23, the fourth terminal 24, the fifth terminal 25 and the sixth terminal 26.

Figure 4:
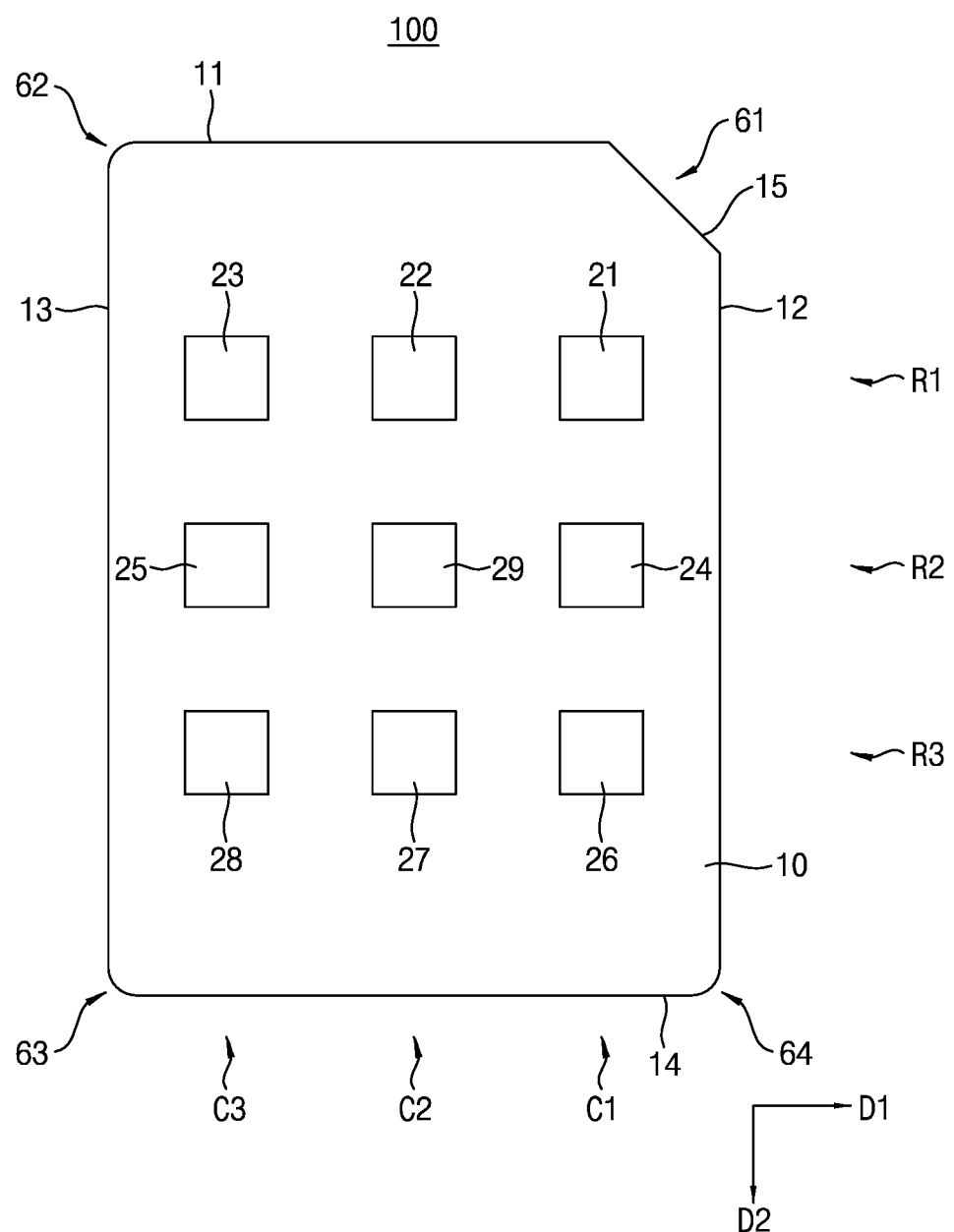

Referring to FIG. 4, in an embodiment, the first terminal 21, the second terminal 22, the third terminal 23, the fourth terminal 24, the fifth terminal 25, the sixth terminal 26, the seventh terminal 27, the eighth terminal 28 and the ninth terminal 29 may have substantially the same size, the same shape and the same material.

Figure 5:
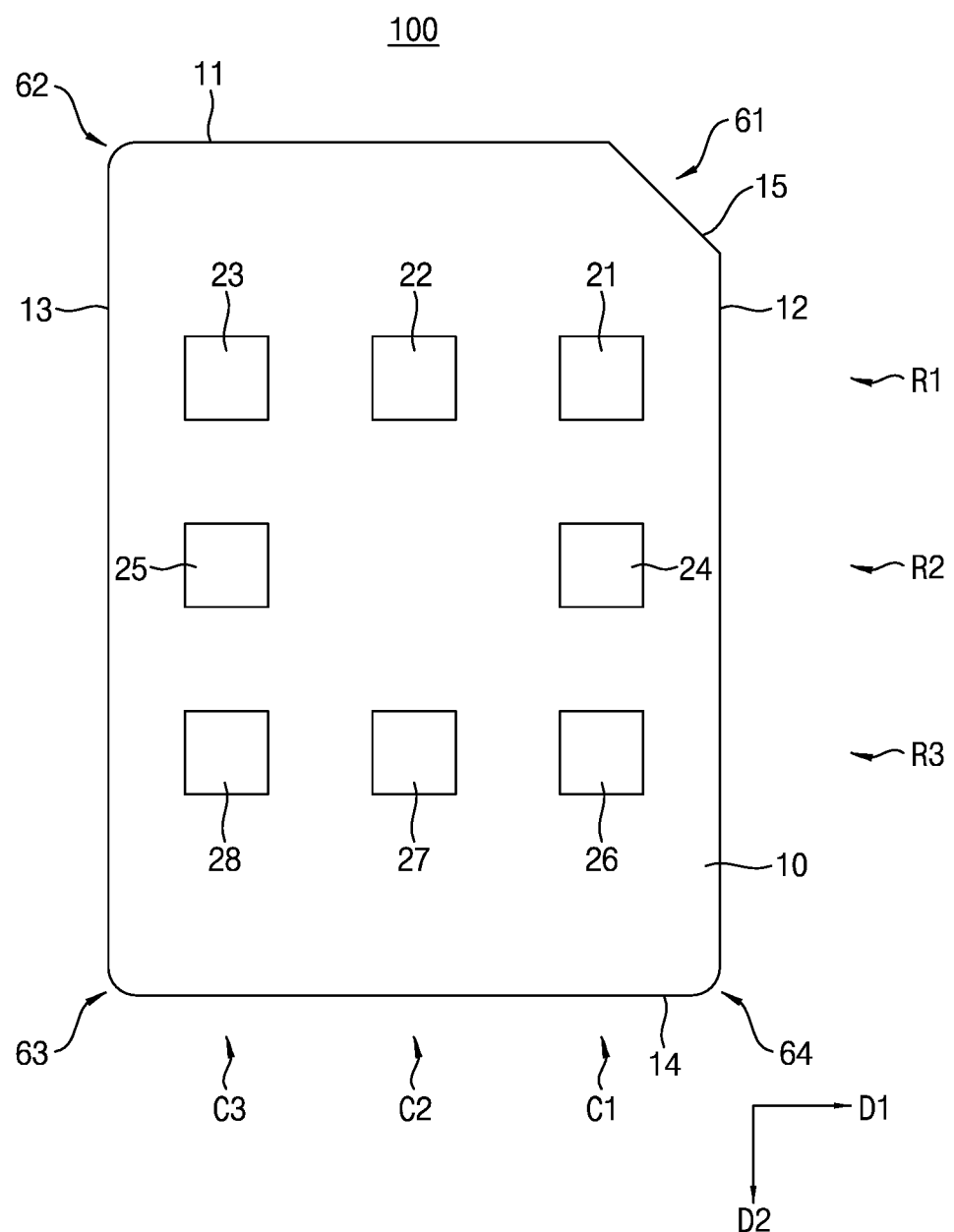

Referring to FIG. 5, in an embodiment, the first terminal 21, the second terminal 22, the third terminal 23, the fourth terminal 24, the fifth terminal 25, the sixth terminal 26, the seventh terminal 27 and the eighth terminal 28 may have substantially the same size, the same shape and the same material.

Figure 6:
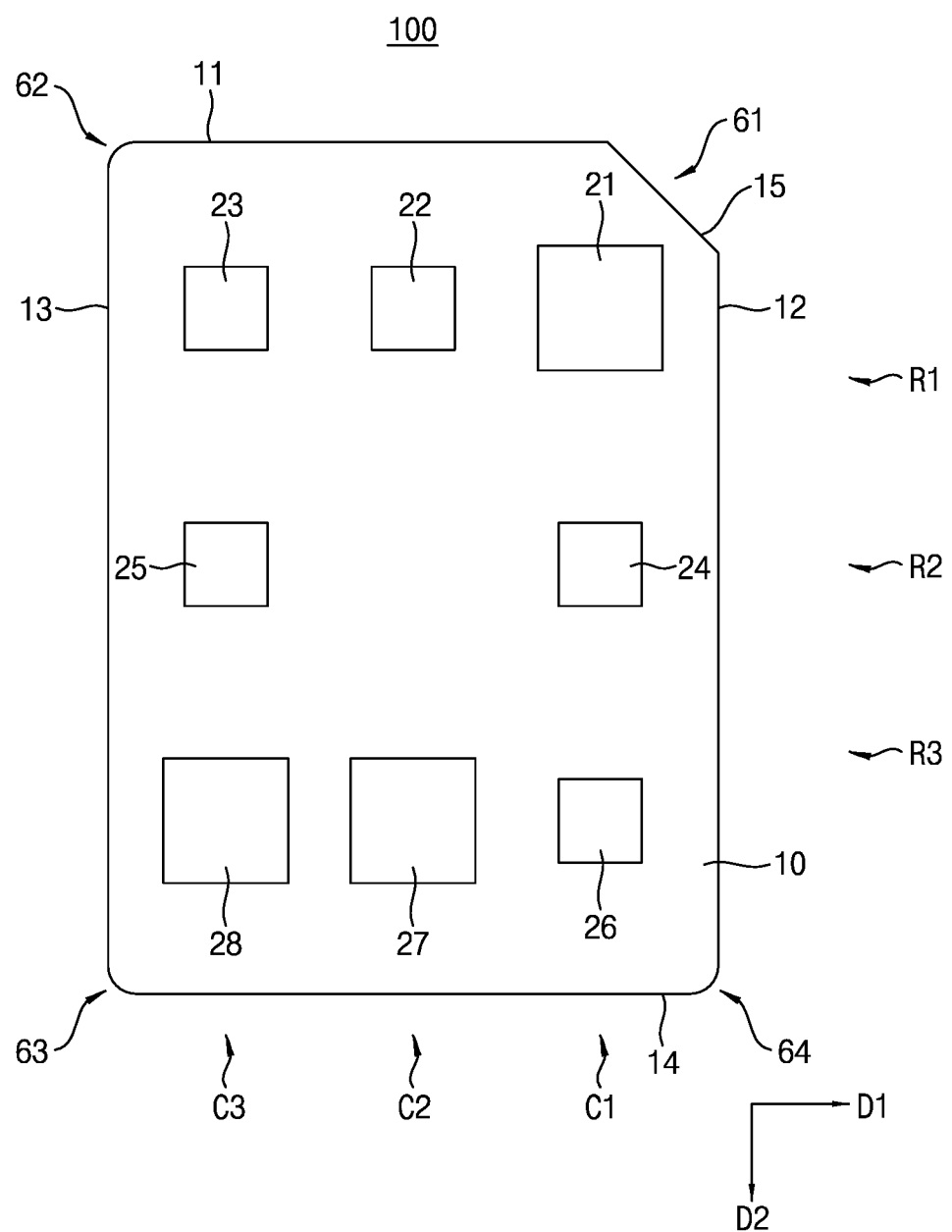

Referring to FIG. 6, the distance between the center of the third terminal 23 and the center of the fifth terminal 25 may differ from the distance between the center of the first terminal 21 and the center of the second terminal 22. The distance between the center of the third terminal 23 and the center of the fifth terminal 2S may be greater than the distance between the center of the first terminal 21 and the center of the second terminal 22. The distance between the center of the first terminal 21 and the center of the fourth terminal 24 may be substantially equal to the distance between the center of the third terminal 23 and the center of the fifth terminal 25. The distance between the center of the first terminal 21 and the center of the fourth terminal 24 may be greater than the distance between the center of the first terminal 21 and the center of the second terminal 22.

The distance between the center of the fifth terminal 25 and the center of the eighth terminal 28 may be substantially equal to the distance between the center of the third terminal 23 and the center of the fifth terminal 25. The distance between the center of the fifth terminal 25 and the center of the eighth terminal 28 may be greater than the distance between the center of the first terminal 21 and the center of the second terminal 22. The distance between the center of the fourth terminal 24 and the center of the sixth terminal 26 may be substantially equal to the distance between the center of the fifth terminal 25 and the center of the eighth terminal 28. The distance between the center of the fourth terminal 24 and the center of the sixth terminal 26 may be greater than the distance between the center of the first terminal 21 and the center of the second terminal 22. In an embodiment, straight lines sequentially connecting the centers of the first to eighth terminals 21 to 28 may form a rectangle.

Figure 7:
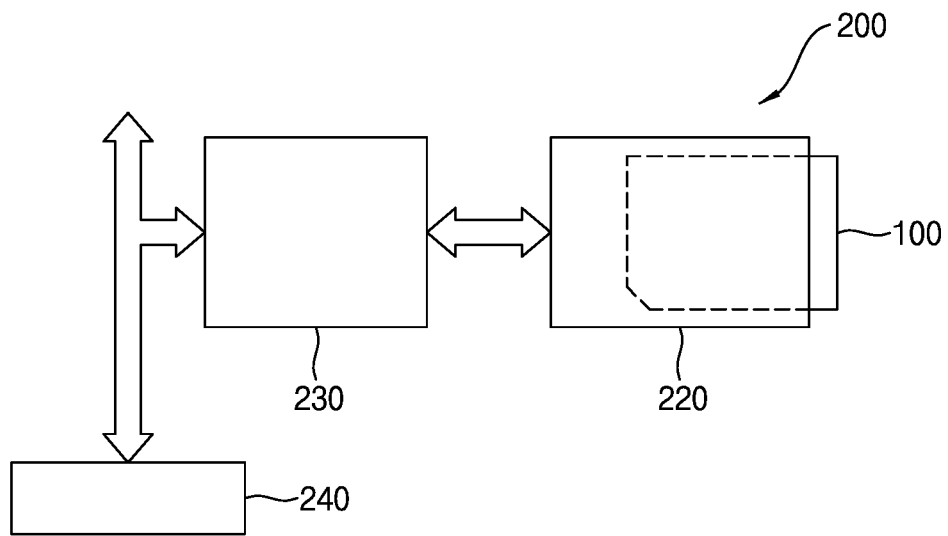
FIGS. 7 and 8 are block diagrams illustrating an electronic system, to which a memory card is applied, according to exemplary embodiments of the present disclosure.
Figure 8:
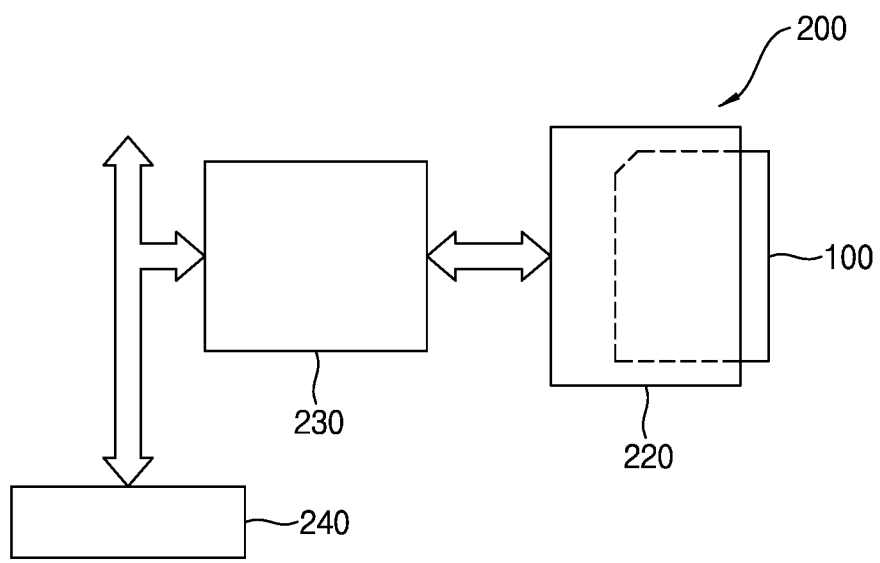

FIGS. 7 and 8 are block diagrams illustrating an electronic system, to which a memory cord is applied, according to exemplary embodiments of the disclosure.

Referring to FIG. 7, an electronic system 200, according to exemplary embodiments of the disclosure, may include a memory card 100, a socket 220, a card interface controller 230 and a host 240. The memory card 100 may include a configuration similar to the configuration described in conjunction with FIGS. 1 to 6. The memory card 100 may be inserted into the socket 220, for example, in a second direction ("D2" in FIG. 1). The socket 220 may include a plurality of socket pins that may be connected to the plurality of interconnection terminals 21, 22, 23, 24, 25, 26, 27 and 28. The socket 220 may be electrically connected to the plurality of interconnection terminals 21, 22, 23, 24, 25, 26, 27 and 28.

The card interface controller 230 may control data exchange with the memory card 100 through the socket 220. The card interface controller 230 may be used to store and/or read data in the memory card 100. The host 240 may control the card interface controller 230.

Referring to FIG. 8, the memory card 100 may be inserted into the socket 200, for example, in a first direction ("D1" in FIG. 1).

Again, referring to FIGS. 7 and 8, the memory card 100 may be inserted in only one direction selected from two directions on the basis of the design of the socket 220, for example, one of the first direction ("D1" in FIG. 1) and the second direction ("D2" in FIG. 1).

In accordance with the exemplary embodiments of the disclosure, a plurality of interconnection terminals aligned in a row direction and a column direction may be provided. Each of the plurality of interconnection terminals may include a substantial square, a substantial regular polygon, a substantial circle or a combination thereof. In accordance with the arrangement of the plurality of interconnection terminals, two-way insertion of a memory card may be possible. In accordance with the arrangement of the plurality of interconnection terminals, durability and electrical characteristics of the memory card may be enhanced. The memory card, which has the plurality of efficiently arranged interconnection terminals, and an electronic system associated therewith may be embodied.

While the embodiments of the disclosure have been described with reference to the accompanying drawings, it should be understood by those skilled in the art that various transitions may be made without departing from the scope of the disclosure and without changing essential features thereof. Therefore, the above-described embodiments should be considered in a descriptive sense only and not for purposes of limitation.

What is claimed is:
1. A memory card, composing:
a substrate;
a plurality of interconnection terminals aligned in a row direction and a column direction on the substrate, each of the plurality of interconnection terminals having a first-axis length equal to no more than 1.2 times that of a second-axis length thereof, wherein the first-axis length is not smaller than the second-axis length; and
a non-volatile memory device disposed on the substrate and electrically connected to at least one interconnection terminal from among the plurality of interconnection terminals, wherein each of the plurality of interconnection terminals has a shape that is a substantial square, a substantial regular polygon, a substantial circular or a combination thereof.

2. The memory card according to claim 1, wherein the substrate comprises:
a first edge extending in the row direction,
a second edge extending in the column direction while being adjacent to the first edge,
a third edge opposing the second edge while being adjacent to the first edge, and
a fourth edge opposing the first edge while being adjacent to the second edge and the third edge;
the plurality of interconnection terminals comprise:
a first terminal adjacent to a first corner at which an extension line of the first edge and extension line of the second edge intersect with each other, and
a second terminal adjacent to a third corner at which an extension line of the third edge and an extension line of the fourth edge intersect with each other; and
the plurality of interconnection terminals further includes additional terminals that are symmetrically disposed with respect to a straight line passing through a center of the first terminal a center of the second terminal.

3. The memory card according to claim 1, wherein the plurality of interconnection terminals comprise:
a ground terminal;
a first power terminal with a first voltage applied, thereto;
a second power terminal with a second voltage applied thereto, the second voltage being lower than the first voltage; and
a plurality of data input/output terminals.

4. The memory card according to claim 3, wherein the plurality of data input/output terminals comprise:
a pair of data receiving terminals; and
a pair of data transmitting terminals.

5. The memory card according to claim 3, wherein the plurality of interconnection terminals further include a clock signal terminal.

6. An electronic system, comprising:
a bus;
a controller connected to the bus;
an input/output device connected to the bus;
an interface connected to the bus; and
a memory device connected to the bus,
wherein the memory device comprises the memory card of claim 1.

7. A memory card, comprising:
a substrate;
a plurality of interconnection terminals aligned in a row direction and a column direction on the substrate, each of the plurality of interconnection terminals having a first axis length equal to no more than 1.2 times that of a second-axis length thereof, wherein the first-axis length is not smaller than the second-axis length; and
a non-volatile memory device disposed on the substrate and electrically connected to at least one interconnection terminal corresponding thereto from among the plurality of interconnection terminals,
wherein the substrate comprises a first edge extending in the row direction, a second edge extending in the column direction while being adjacent to the first edge, a third edge opposing the second edge while being adjacent to the first edge, a fourth edge opposing the first edge while being adjacent to the second edge and the third edge, and a direction indicator edge adjacent to a first corner at which an extension line of the first edge and an extension line of the second edge intersect with each other,
wherein the plurality of interconnection terminals comprise:
first to third terminals disposed at a first row adjacent to the first edge,
fourth and fifth terminals disposed at a second row, and
sixth to eighth terminals disposed at a third row adjacent to the fourth edge,
wherein the second row is disposed between the first row and the third row,
wherein the first terminal, the fourth terminal and the sixth terminal are disposed at a first column adjacent to the second edge,
wherein the second terminal and the seventh terminal are disposed at a second column,
wherein the third terminal, the fifth terminal and the eighth terminal are disposed at a third column adjacent to the third edge,
wherein the second column is disposed between the first column and the third column, and
wherein each of the plurality of interconnection terminals has a shape that is a substantial square, a substantial regular polygon, a substantial circle or a combination thereof.

8. The memory card according to claim 7, wherein:
the first terminal is a ground terminal;
the eighth terminal is a first power terminal having a first voltage applied thereto;
the seventh terminal is a second power terminal having a second voltage applied thereto, wherein the second voltage is lower than the first voltage;
the fifth terminal is a clock signal terminal;
the second terminal and the third terminal are a first pair of data transmitting terminals using serial interface technology; and
the fourth terminal and the sixth terminal are a second pair of data receiving terminals using serial interface technology.

9. The memory card according to claim 7, wherein:
the first terminal is disposed adjacent to the direction indicator edge;
the eighth terminal is disposed adjacent to a third edge at which an extension line of the third edge and an extension line of the fourth edge intersect with each other; and
centers of the second ter the third terminal, the fourth terminal, the fifth terminal, the sixth terminal and the seventh terminal are symmetrically disposed with respect to a straight line passing through a center of the first terminal and a center of the eighth terminal.

10. The memory card according to claim 7, wherein:
the first terminal is disposed adjacent to the direction indicator edge:
the eighth terminal is disposed adjacent to a third corner at which an extension line of the third edge and an extension line of the fourth edge intersect with each other; and
the second terminal and the third terminal are disposed symmetrically with the fourth terminal and the sixth terminal with respect to a straight line passing through a center of the first terminal and a center of the eighth terminal.

11. The memory card according to claim 7, wherein each of the first terminal, the seventh terminal and the eighth terminal has a greater cross-sectional area than each of the second terminal, the third terminal, the fourth terminal, the fifth terminal and the sixth terminal.

12. The memory card according to claim 7, wherein each of the first terminal, the seventh terminal and the eighth terminal has a shape of a substantial square with a side length of 1.5 mm to 1.9 mm.

13. The memory card according to claim 7, wherein each of the second terminal, the third terminal, the fourth terminal, the fifth terminal and the sixth terminal has a shape of a substantial square with a side length of 1.0 mm to 1.4 mm.

14. The memory card according to claim 7, wherein:
a minimum distance between the first edge and the first terminal is smaller than a minimum distance between the first edge and the second terminal;
the minimum distance between the first edge and the first terminal is smaller than a minimum distance between the first edge and the third terminal;
a minimum distance between the second edge and the first terminal is smaller than a minimum distance between the second edge and the fourth terminal; and
the minimum distance between the second edge and the first terminal is smaller than a minimum distance between the second edge and the sixth terminal.

15. The memory card according to claim 7, wherein:
a distance between a center of the first terminal and a center of the second terminal is a first pitch, a distance between the center of the second terminal and a center of the third terminal is a second pitch, and the second pitch is substantially equal to the first pitch; and
a distance between the center of the third terminal and a center of the fifth terminal is a third pitch, a distance between the center of the fifth terminal and a center of the eighth terminal is a fourth pitch, and the fourth pitch is substantially equal to the third pitch.

16. The memory card according to claim 15, wherein each of the second pitch, the third pitch and the fourth pitch is substantially equal to the first pitch.

17. The memory card according to claim 15, wherein each of the first pitch, the second pitch, the third pitch and the fourth pitch is within a range of 2.5 mm to 3.0 mm.

18. The memory card according to claim 7, wherein straight line segments sequentially connecting centers of the first to eighth terminals is a substantial square.

19. The memory card according to claim 7, further comprising:
a ninth terminal disposed between the fourth terminal and the fifth terminal at the second row,
wherein the ninth terminal is disposed between the second terminal and the seventh terminal at the second column.

* * * * *